(12) United States Patent
Shimamoto

(10) Patent No.: US 9,461,049 B2
(45) Date of Patent: Oct. 4, 2016

(54) SEMICONDUCTOR DEVICE

(71) Applicant: PS4 LUXCO S.A.R.L., Luxembourg (LU)

(72) Inventor: Kazuma Shimamoto, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/706,475

(22) Filed: May 7, 2015

(65) Prior Publication Data

US 2015/0243666 A1    Aug. 27, 2015

Related U.S. Application Data

(63) Continuation of application No. 13/767,193, filed on Feb. 14, 2013, now Pat. No. 9,035,368.

(30) Foreign Application Priority Data

Feb. 16, 2012    (JP) .................. 2012-031809

(51) Int. Cl.
*H01L 27/108*    (2006.01)
*H01L 23/535*    (2006.01)
*H01L 29/16*    (2006.01)
*H01L 29/78*    (2006.01)

(52) U.S. Cl.
CPC ....... *H01L 27/10814* (2013.01); *H01L 23/535* (2013.01); *H01L 27/10823* (2013.01); *H01L 27/10855* (2013.01); *H01L 27/10876* (2013.01); *H01L 29/16* (2013.01); *H01L 29/7827* (2013.01); *H01L 27/10885* (2013.01); *H01L 27/10891* (2013.01); *H01L 2924/0002* (2013.01)

(58) Field of Classification Search
CPC .................. H01L 27/10823; H01L 27/10891; H01L 27/10885; H01L 23/535
USPC .................................. 257/296, 334
See application file for complete search history.

(56) References Cited

U.S. PATENT DOCUMENTS

| 8,742,493 B2* | 6/2014 | Kim ................. | H01L 27/10876 257/302 |
| 8,866,216 B2* | 10/2014 | Ha .................... | H01L 27/10823 257/306 |
| 2006/0160323 A1* | 7/2006 | Wells ................ | H01L 27/10808 438/424 |
| 2011/0159660 A1* | 6/2011 | Kang ................ | H01L 27/10817 438/381 |
| 2012/0012926 A1* | 1/2012 | Ha .................... | H01L 27/10823 257/330 |
| 2012/0119286 A1* | 5/2012 | Kim .................. | H01L 27/10876 257/329 |

FOREIGN PATENT DOCUMENTS

JP    2011-138883 A    7/2011

* cited by examiner

*Primary Examiner* — Caridad Everhart

(57) ABSTRACT

Provided is a semiconductor device including first and second semiconductor pillars formed on a surface of a semiconductor substrate and aligning in a first direction; a first interconnect extending in a second direction intersecting with the first direction and provided between the first and second semiconductor pillars; and a first contact pad located over the first interconnect, the first contact pad being in contact with and electrically connected to the first semiconductor pillar at a side surface thereof, while being electrically isolated from the second semiconductor pillar.

7 Claims, 13 Drawing Sheets

SEMICONDUCTOR DEVICE

BACKGROUND OF THE INVENTION

1. Field of the Invention

The present invention relates to a semiconductor device.

2. Description of the Related Art

Currently, a one-transistor/one-capacitor structure is adopted as a structure of basic cells included in a DRAM (Dynamic Random Access Memory). Along with the progress of miniaturization in semiconductor devices, a cell area per bit has been reduced from 8F2 to 6F2 and further to 4F2 in terms of an F value representing the minimum feature size. Accordingly, a vertical transistor in which channels are formed in the vertical direction of a substrate rather than in the horizontal direction thereof has been employed as a cell transistor. A three-dimensional transistor, among others, which uses a silicon pillar extending perpendicularly to the principal surface of a semiconductor substrate as a channel, has advantages of being small in occupied area and able to obtain a large drain current due to the complete depletion of carriers. Thus, even the densest layout of 4F2 is feasible using such a transistor.

Generally, one of impurity-diffusion layers to serve as a source and a drain is connected to a bit line and the other impurity-diffusion layer is connected to a capacitor of a DRAM when a vertical transistor using a silicon pillar is employed as a cell transistor of the DRAM. Under normal conditions, the capacitor is located above the cell transistor. Accordingly, the capacitor is connected to an upper impurity-diffusion layer of the silicon pillar, and a bit line is connected to a lower impurity-diffusion layer of the silicon pillar.

On the other hand, the stable operation and reliability of the DRAM are secured at above a specific level of capacitance. To that end, a method is available in which the structure of a capacitor is made three-dimensional to secure a surface area. An example in which a three-dimensionally structured capacitor is connected to a vertical transistor is proposed in, for example, JP2011-77185A.

Currently, a contact pad is used in a DRAM of a 60 nm node or later to secure a contact area between the lower electrode (storage node electrode of a capacitor, which is hereinafter referred to as "SN electrode") and a contact plug, thereby preventing a contact resistance from increasing.

As described above, three-dimensional pillar-type transistors are adopted as cell transistors to form arrays as fine as 4F2 or the like. Consequently, allowable margins of lithography and dry etching processes for the purpose of forming contact pads have become even smaller. Thus, it has become increasingly difficult to secure a desired contact area.

SUMMARY

According to one embodiment of the present invention, there is provided a semiconductor device including:

first and second semiconductor pillars formed on a surface of a semiconductor substrate and aligning in a first direction;

a first interconnect extending in a second direction intersecting with the first direction and provided between the first and second semiconductor pillars; and a first contact pad located over the first interconnect, the first contact pad being in contact with and electrically connected to the first semiconductor pillar at a side surface thereof, while being electrically isolated from the second semiconductor pillar.

According to another embodiment of the present invention, there is provided a semiconductor device including:

a plurality of semiconductor pillars formed on a surface of a semiconductor substrate and aligning in a first direction;

a plurality of contact pads respectively provided between the two semiconductor pillars adjacent to each other in the first direction, each of the plurality of the contact pads being electrically connected to an upper portion of one side surface of each of the plurality of the semiconductor pillars in the first direction; and a first interconnect extending in the first direction, the first interconnect being electrically connected to a lower portion of another side surface of each of the plurality of the semiconductor pillars.

According to yet another embodiment of the present invention, there is provided a semiconductor device including:

a trench formed on a surface of a semiconductor substrate and extending in a first direction;

a first interconnect embedded in a lower portion of the trench;

an insulator located on the first interconnect and embedded in an intermediate portion of the trench; and a contact pad located on the insulator and disposed in an upper portion of the trench, the contact pad being in contact with and electrically connected to the semiconductor substrate at one of both walls of the trench.

In the present invention, a contact pad is self-alignedly formed on one sidewall of a silicon pillar to eliminate the need for lithography and dry etching processes for the purpose of forming the contact pad. Consequently, it is possible to provide a structure in which a desired contact area is secured.

BRIEF DESCRIPTION OF THE DRAWINGS

The above features and advantages of the present invention will be more apparent from the following description of certain preferred embodiments taken in conjunction with the accompanying drawings, in which:

FIGS. 9A to 9C illustrate a semiconductor device according to one exemplary embodiment of the present invention, wherein FIG. 9A is a schematic transverse cross-sectional view, FIG. 9B is a vertical cross-sectional view taken on line X1-X1 of FIG. 9A, and FIG. 9C is a vertical cross-sectional view taken on line A-A of FIG. 9A.

DETAILED DESCRIPTION OF THE PREFERRED EMBODIMENTS

Figure 1A:
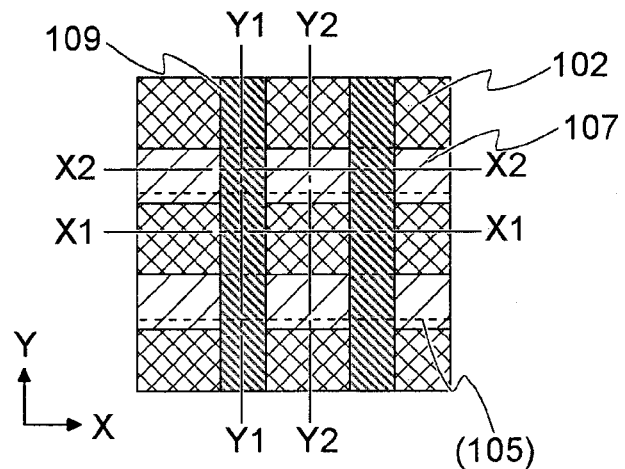
FIGS. 1A to 1E, 2A to 2E, 3A to 3E, 4A to 4E, 5A to 5E, 6A to 6E, 7A to 7E and 8A to 8E illustrate a manufacturing process of a semiconductor device according to one exemplary embodiment of the present invention, wherein each figure suffixed with A is a plan view, each figure suffixed with B is a vertical cross-sectional view taken on line X1-X1, each figure suffixed with C is a vertical cross-sectional view taken on line X2-X2, each figure suffixed with D is a vertical cross-sectional view taken on line Y1-Y1, and each figure suffixed with E is a vertical cross-sectional view taken on line Y2-Y2.
Figure 1B:
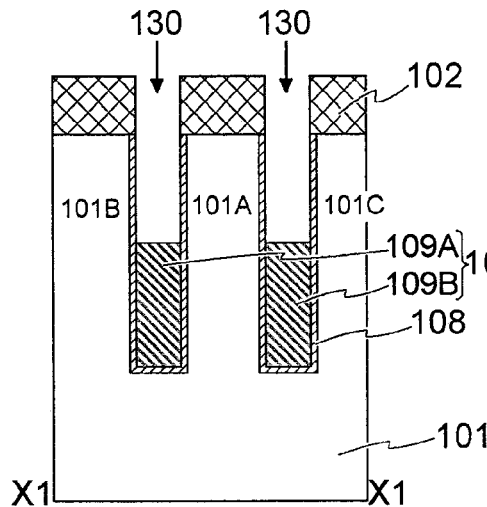
Figure 1C:
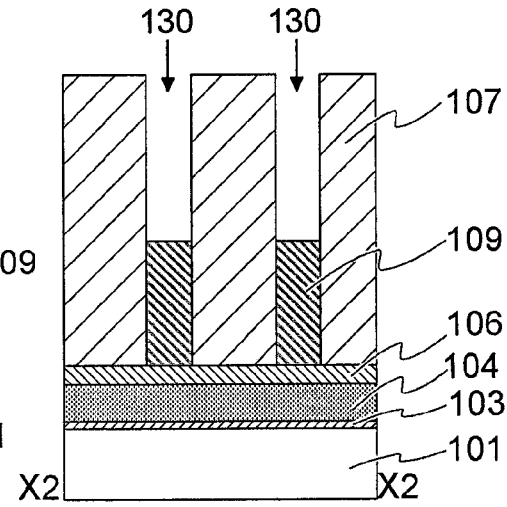
Figure 1D:
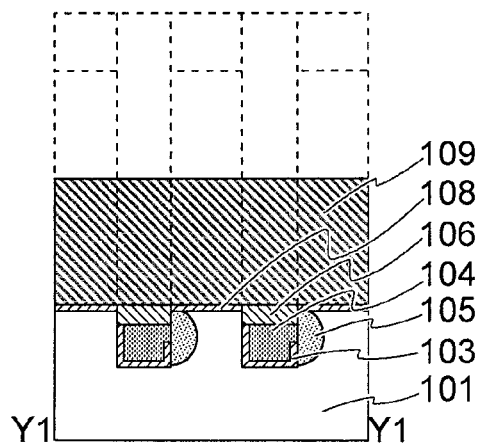
Figure 1E:
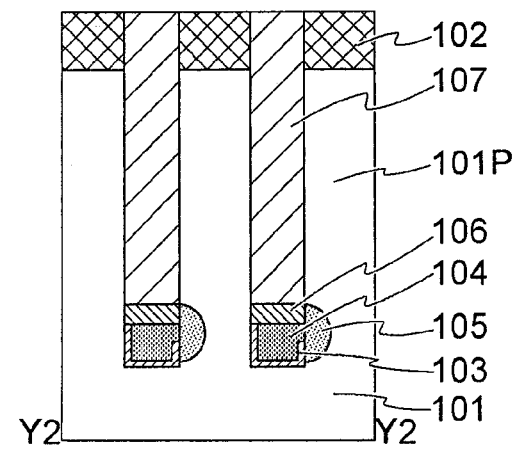
Figure 2A:
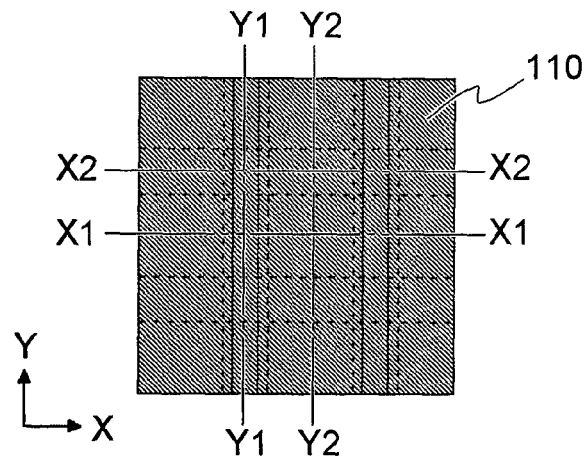
Figure 2B:
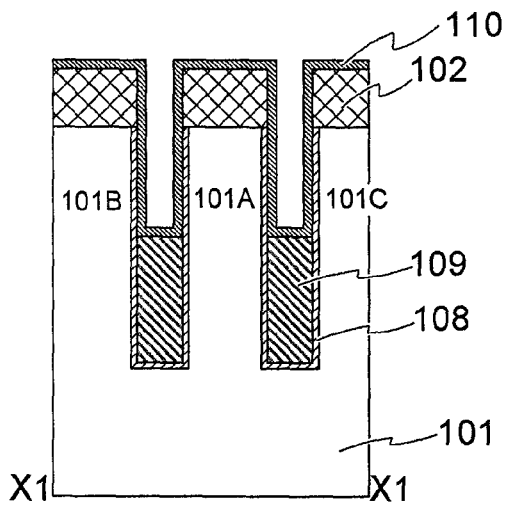
Figure 2C:
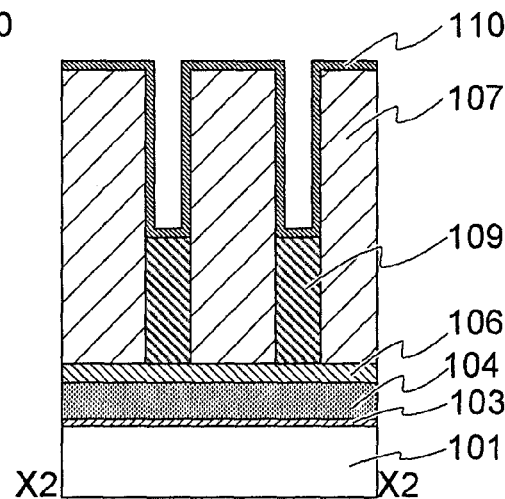
Figure 2D:
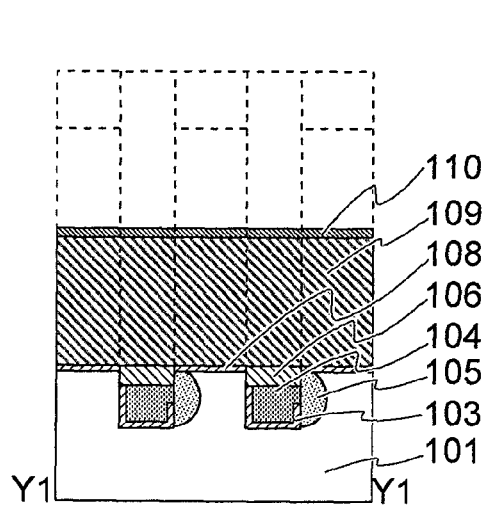
Figure 2E:
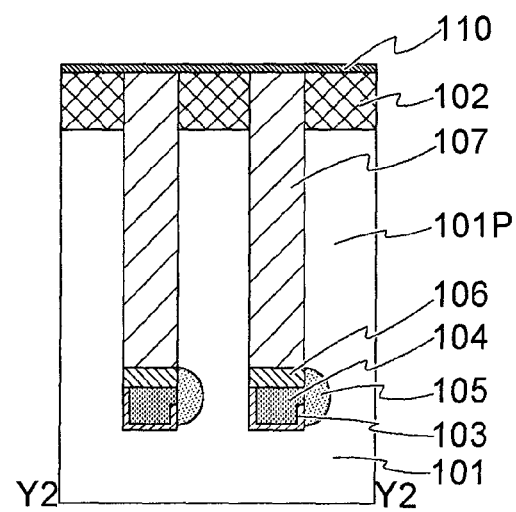
Figure 3A:
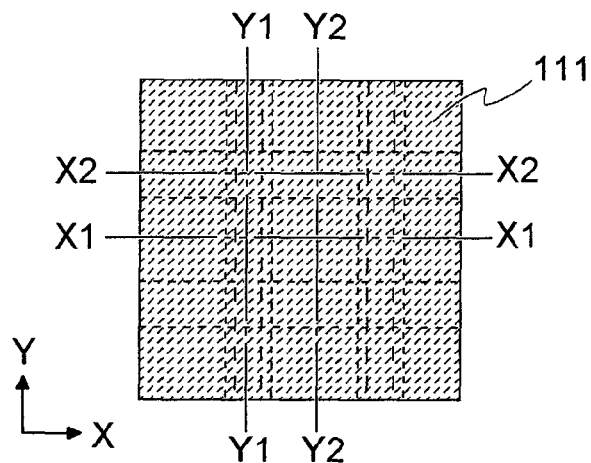
Figure 3B:
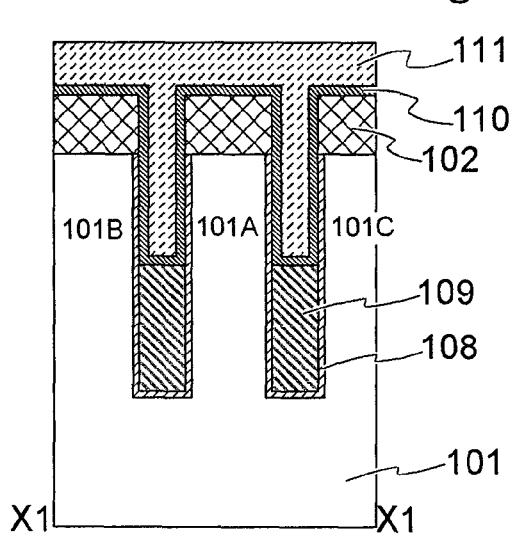
Figure 3C:
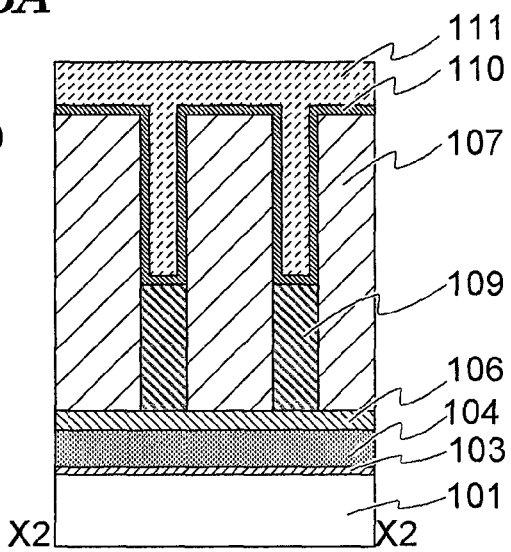
Figure 3D:
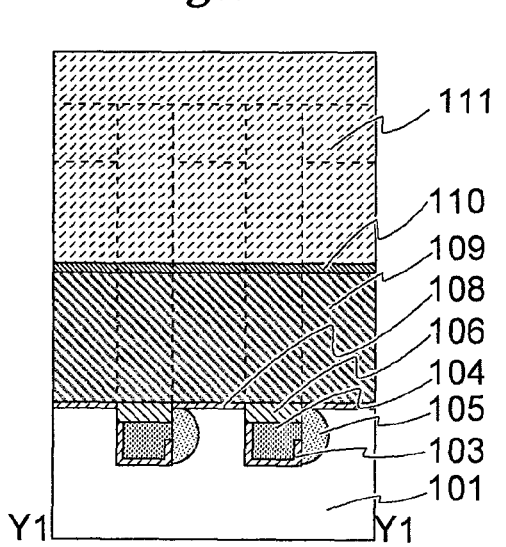
Figure 3E:
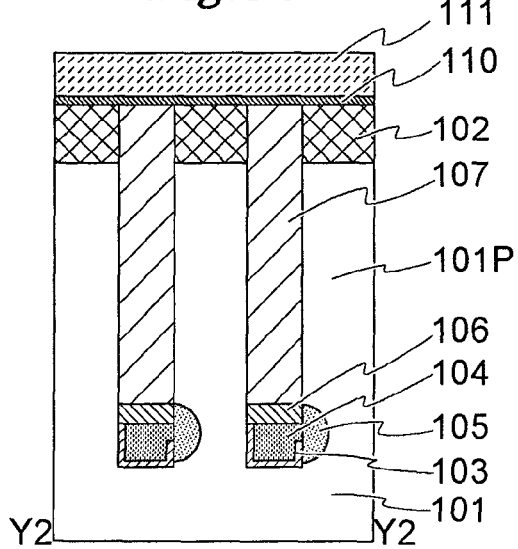
Figure 4A:
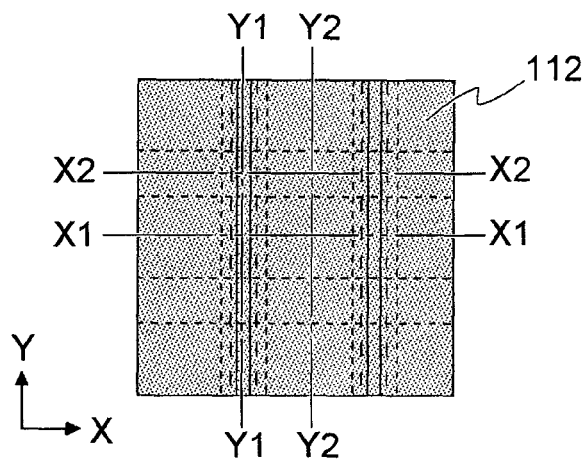
Figures 4B, 4C:
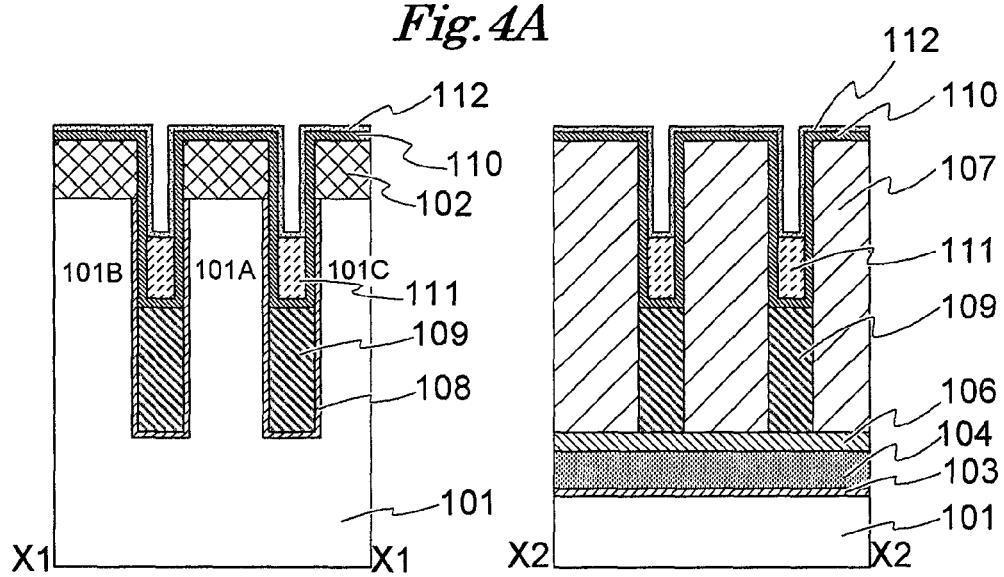
Figures 4D, 4E:
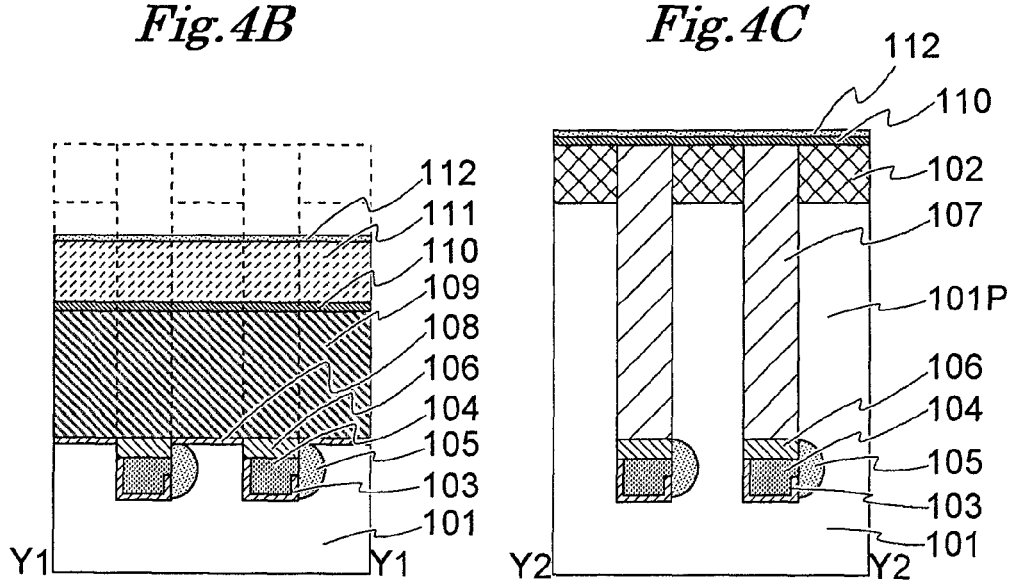
Figure 5A:
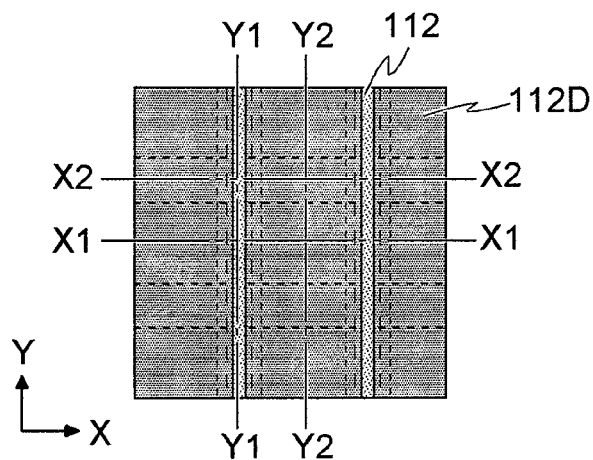
Figure 5B:
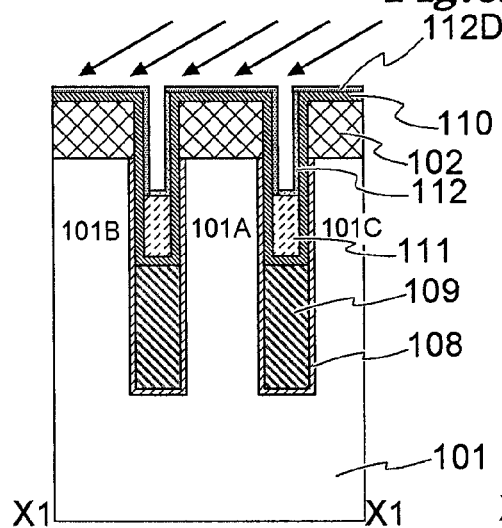
Figure 5C:
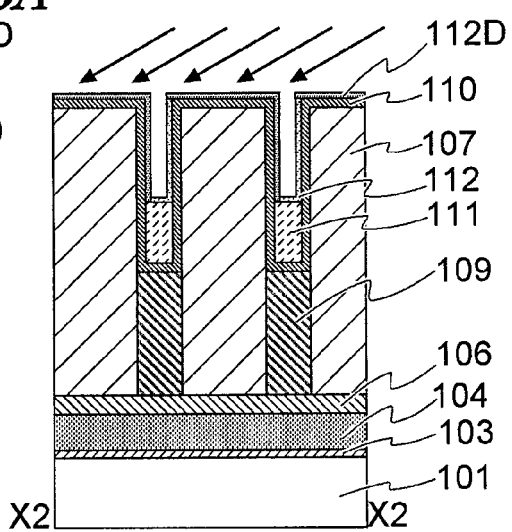
Figure 5D:
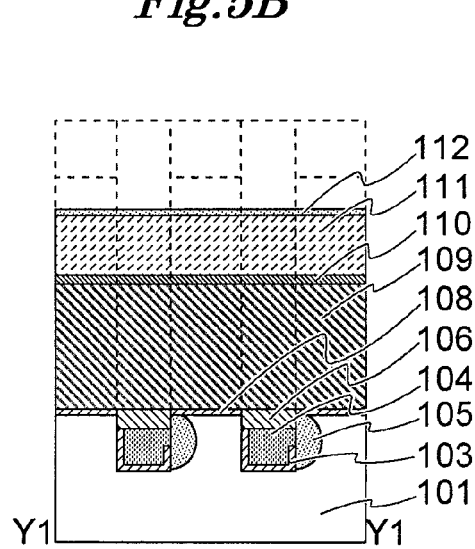
Figure 5E:
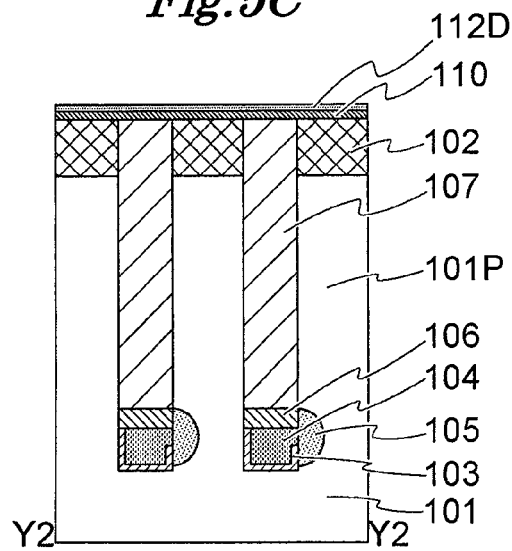
Figure 6A:
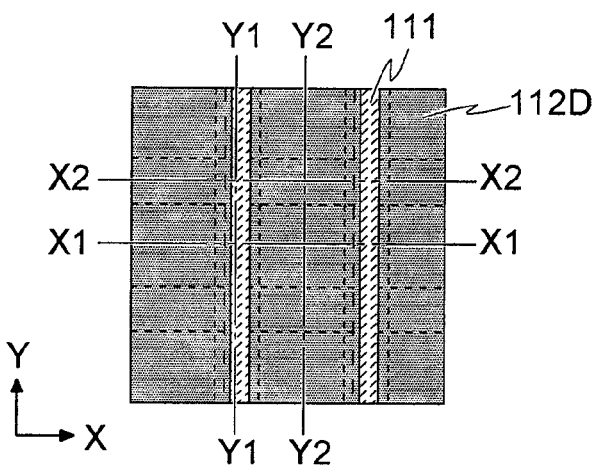
Figures 6B, 6C:
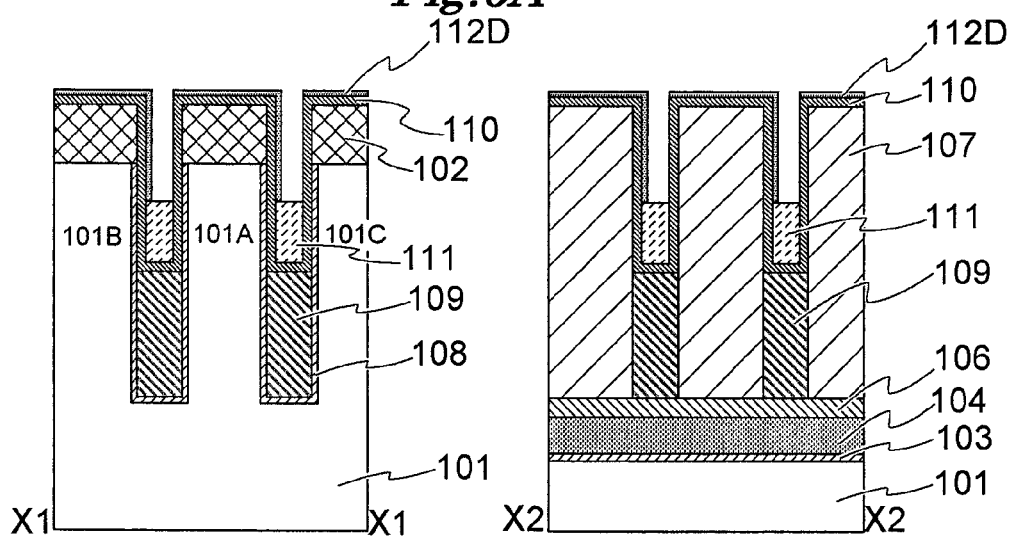
Figures 6D, 6E:
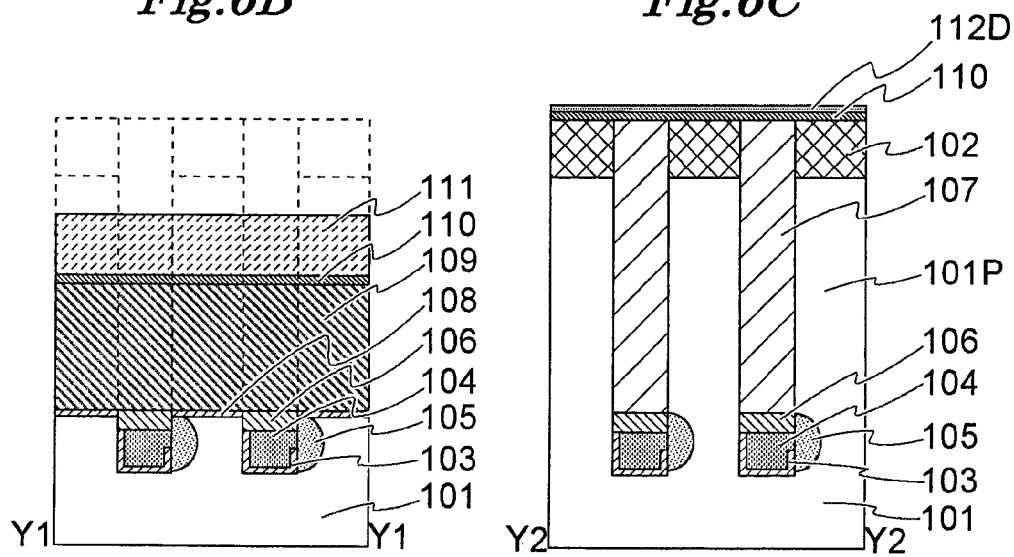

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Note that the terms "first," "second," and the like are used herein for descriptive purposes, in order to describe the order of constituent features, and therefore, are not fixed to any specific constituent elements.

FIGS. 1A to 1E, 2A to 2E, 3A to 3E, 4A to 4E, 5A to 5E, 6A to 6E, 7A to 7E and 8A to 8E illustrate a manufacturing process of a semiconductor device according to one exemplary embodiment of the present invention, wherein each figure suffixed with A is a plan view, each figure suffixed with B is a vertical cross-sectional view taken on line X1-X1, each figure suffixed with C is a vertical cross-sectional view taken on line X2-X2, each figure suffixed with D is a vertical cross-sectional view taken on line Y1-Y1, and each figure suffixed with E is a vertical cross-sectional view taken on line Y2-Y2. Note that in the following description, figures such as FIGS. 1A to 1E are collectively referred to FIG. X such as FIG. 1 unless the figures need to be described individually.

First, in the same way as described in JP2011-77185A, first silicon nitride film 102 is formed as a hard mask on a silicon substrate used as semiconductor substrate 101, a first trench extending in a first direction (X direction) is formed, and bit line 104 is formed as a first interconnect (or a lower interconnect). Bit line 104 is electrically isolated from semiconductor substrate 101 by insulating film 103 but has contact therewith at a portion of the bit line from where insulating film 103 is partially removed. Lower diffusion layer 105 is formed in the location of contact between bit line 104 and semiconductor substrate 101 by a heretofore-known method, for example, by such a method as shown in JP2011-77185A. Cap insulating layer 106 is formed on bit line 104. In addition, the first trench is filled back with insulating film 107.

After the formation of the bit line, second trench 130 extending in a second direction (Y direction) intersecting with the first direction is formed, and word line 109 is formed in second trench 130 as a second interconnect. As the result of second trench 130 being formed, a silicon pillar is defined by the first trench mentioned above and second trench 130. In other word, the upper side of the semiconductor substrate 101 includes a semiconductor region and an insulating region (insulating film 107); and trench 130 is formed across the semiconductor region and the insulating region. Here, silicon pillars aligning in the first direction (X direction) are described as first silicon pillar 101A which is positioned in the middle, a second silicon pillar 101B which is positioned on the left, and third silicon pillar 101C which is positioned on the right (see FIG. 1B). In addition, unless the silicon pillars need to be described in an orderly sequence, each silicon pillar is simply described as silicon pillar 101P (see FIG. 1E). Before the formation of a word line, silicon exposed inside second trench 130 is thermally oxidized to form gate insulating film 108 (a first silicon oxide film). At this time, surfaces of first silicon nitride film 102 are also oxidized (not illustrated). Consequently, there is obtained a structure illustrated in FIG. 1.

With attention focused on word line 109, it is understood that word line 109 serving as a first interconnect is embedded in a lower portion of a trench extending in the first direction defined as the Y direction. Here, a word line provided between first silicon pillar 101A and second silicon pillar 101B is called as first word line 109A and a word line provided between first silicon pillar 101A and third silicon pillar 101C is called as second word line 109B (see FIG. 1B).

Next, as illustrated in FIG. 2, second silicon nitride film 110 is formed to such a thickness as not to fill second trench 130. Subsequently, as illustrated in FIG. 3, an organic film, such as a polysilazane film, is coated and baked, and then heat-treated to form SOD (Spin On Dielectric) film 111.

SOD film 111 is planarized by CMP to be level with a surface of first silicon nitride film 102. Thereafter, SOD film 111 is etched back, so as to back away, for example, 80 nm from the upper surface of each silicon pillar. That is, SOD film (insulator) is embedded in an intermediate portion of second trench 130. Then, as illustrated in FIG. 4, amorphous silicon film 112 is formed by an LP-CVD method.

Next, as illustrated in FIG. 5, $BF_2$ ions are obliquely implanted into amorphous silicon film 112 at an angle of 30°. Consequently, one lateral side of silicon pillar 101P remains as amorphous silicon film 112 without being implanted with $BF_2$ ions. The remaining portion turns into doped amorphous silicon film 112D implanted with $BF_2$ ions.

After the ion implantation, amorphous silicon film 112 is selectively removed using diluted aqueous ammonia. Doped amorphous silicon film 112D remains without being removed (FIG. 6).

Second silicon nitride film 110 exposed due to the removal of amorphous silicon film 112 is selectively removed by wet etching. A surface of first silicon nitride film 102 is oxidized, and therefore, not etched (FIG. 7).

Figure 8A:
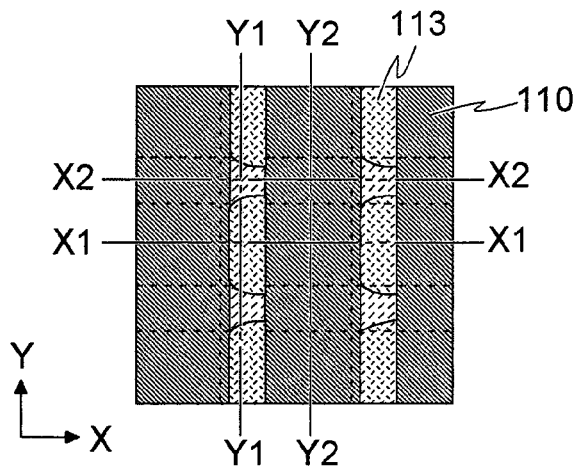

Doped amorphous silicon film 112D is removed by dry etching. In addition, gate insulating film 108 thus exposed is removed by wet etching or the like, thereby exposing one sidewall of silicon pillar 101P. At this time, an oxide film on the surface of first silicon nitride film 102 is also removed. If insulating film 107 is an oxide film, the side surface thereof backs away so as to be almost flush with the exposed surface of the silicon pillar. Next, epitaxial silicon layer 113 is grown from the exposed surface of silicon pillar 101P by an epitaxial growth method. Epitaxial silicon layer 113 is not formed in a portion of insulating film 107 inside the second trench, but is formed in a state of being separated between silicon pillars 101P. The epitaxial silicon layer in the process of its growth is subject to a phenomenon referred to as "facet" in which (1) when the layer abuts on a nitride film, the growth does not stop, and (2) when the layer abuts on an oxide film, such as an SOD film, the growth is suppressed. Accordingly, the epitaxial silicon layer takes such a form as illustrated in FIG. 8. Particularly in the case of an SOD film converted from an organic film, an organic matter remains even after baking for densification, thus greatly impairing the growth of epitaxial silicon. FIG. 8F illustrates an enlarged view of part P1 of FIG. 8B enclosed with a dashed line. That is, the epitaxial silicon layer is characterized by forms in which:

the layer grows while rising to first silicon nitride film 102 located on one exposed side surface of silicon pillar 101P (see reference numeral 113' in FIG. 8F); and a cavity arises in a lower portion of the surface opposite to one exposed side surface of silicon pillar 101P (see reference numeral 113" in FIG. 8F).

Figure 7A:
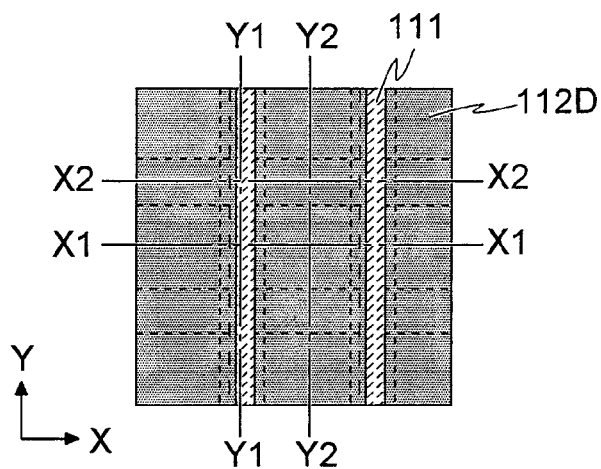
Figures 7B, 7C:
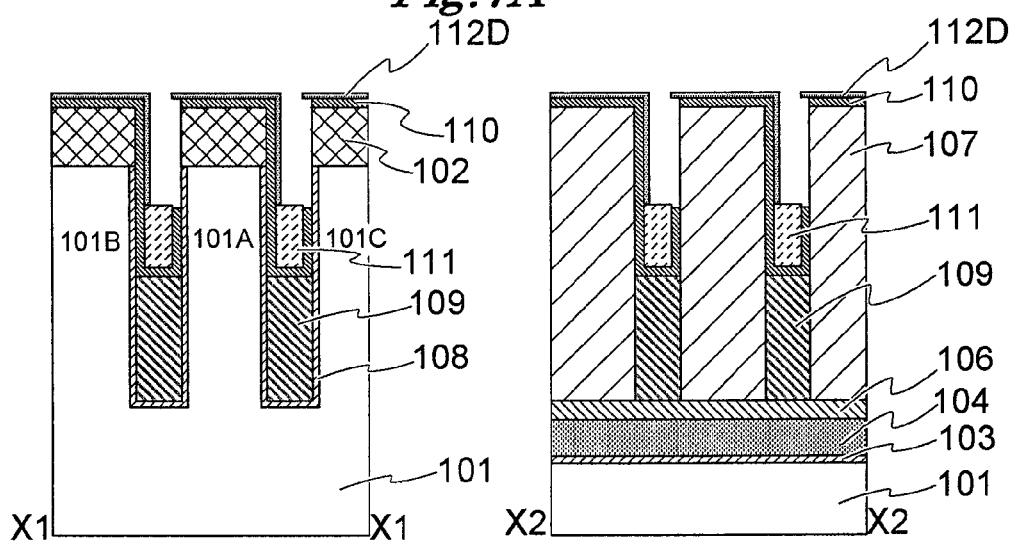
Figures 7D, 7E:
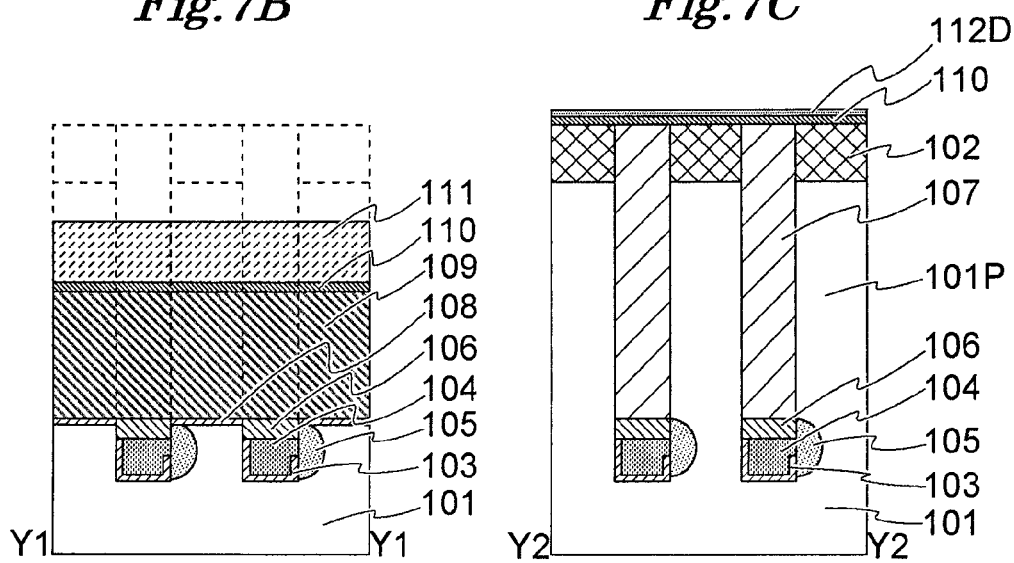

Epitaxial growth is likewise impaired if insulating film 107 is an oxide film. In this case, the epitaxial silicon layer is stretched by epitaxial growth on the upper surface of etched-back second silicon nitride film 110A and the side surface of first silicon nitride film 102 to form into a laterally-protruding shape. FIGS. 8G and 8H are enlarged plan views taken along with Z1-Z1 and Z2-Z2 of FIG. 8F, respectively. As illustrated in FIGS. 8G and 8H, the length of epitaxial silicon layer 113 on the side of a surface thereof in contact with first silicon pillar 101A is greater than the length of epitaxial silicon layer 113 on the side of an opposed surface thereof not in contact with second silicon pillar 101B, i.e., the length of a surface of epitaxial silicon layer 113 in contact with the side surface of unetched-backed second silicon nitride film 110B. The length of epitaxial silicon layer 113 on the side of a surface thereof in contact with first silicon pillar 101A in the second direction is greater than the widths of first and second semiconductor pillars 101A and 101B in the second direction. Although FIGS. 8C, 8G and 8H show that the side surface of insulating film 107, which is an oxide film, has etched back, the present invention is not limited to this configuration. If insulating film 107 is not an oxide film, the side surface of insulating film 107 can be maintained that as shown in FIG. 7C and the facet of epitaxial silicon layer 113 does not appear on the side surface of insulating film 107.

Figure 8B:
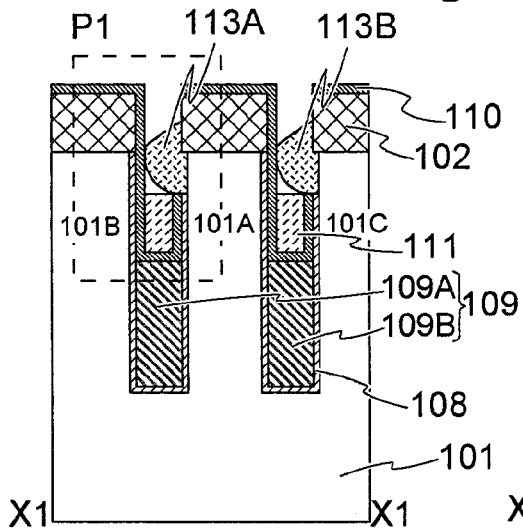
Figure 8C:
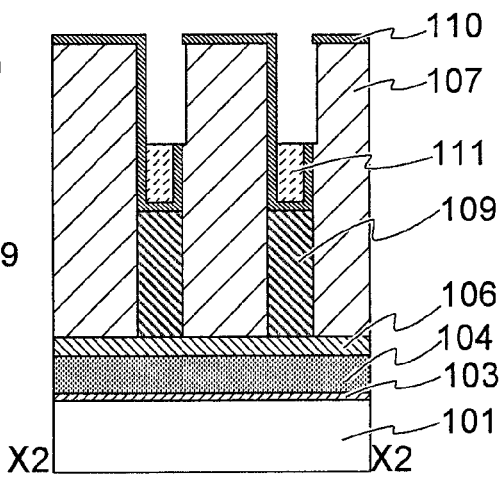
Figure 8D:
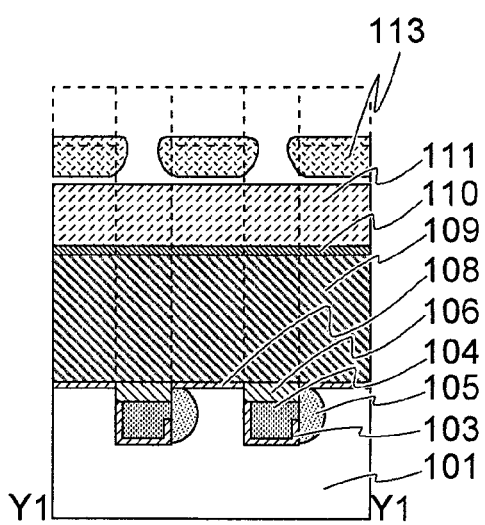
Figure 8E:
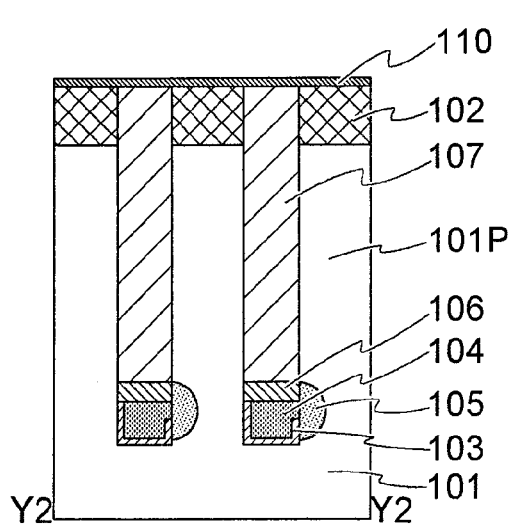
Figure 8F:
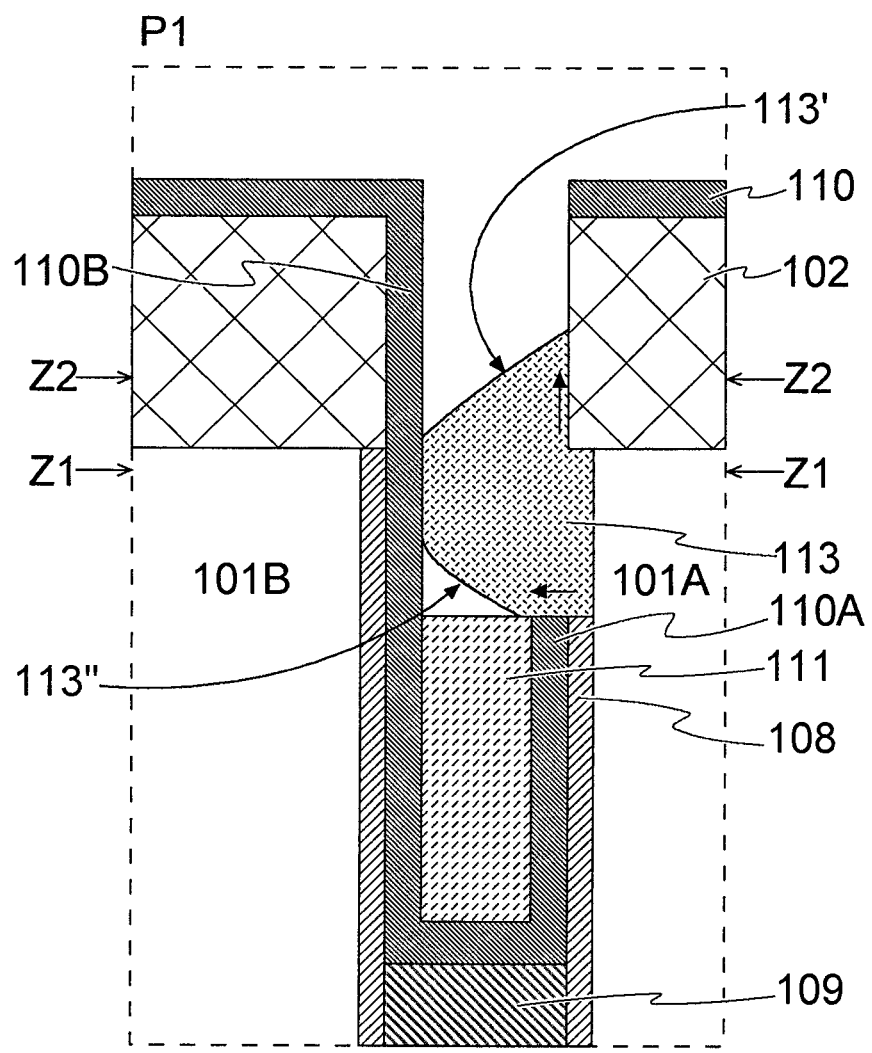
FIG. 8F is an enlarged vertical cross-sectional view of part P1 of FIG. 8B enclosed with a dashed line.
Figure 8G:
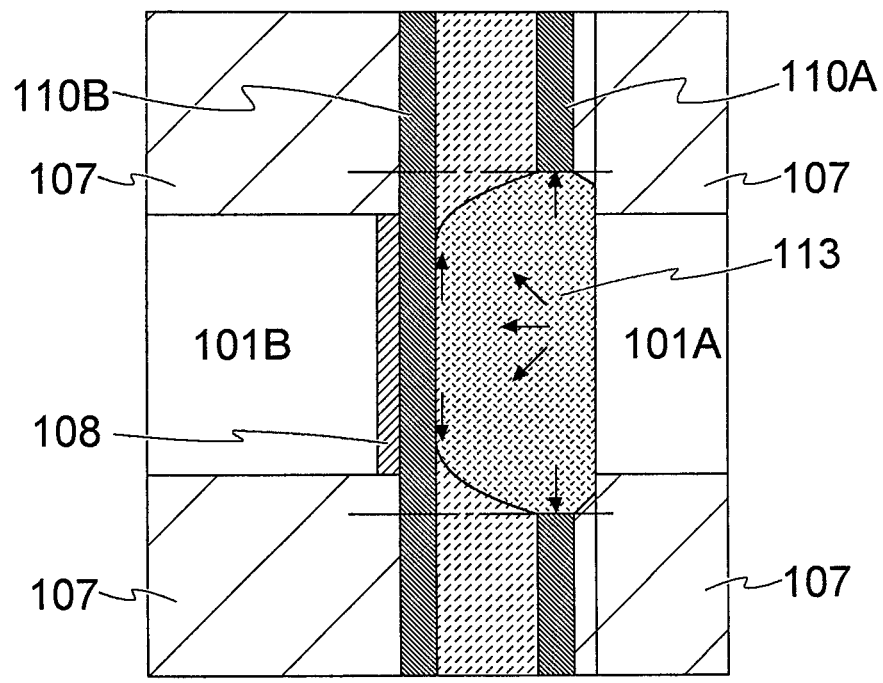
FIG. 8G is an enlarged plan view taken along with Z1-Z1 of FIG. 8F.
Figure 8H:
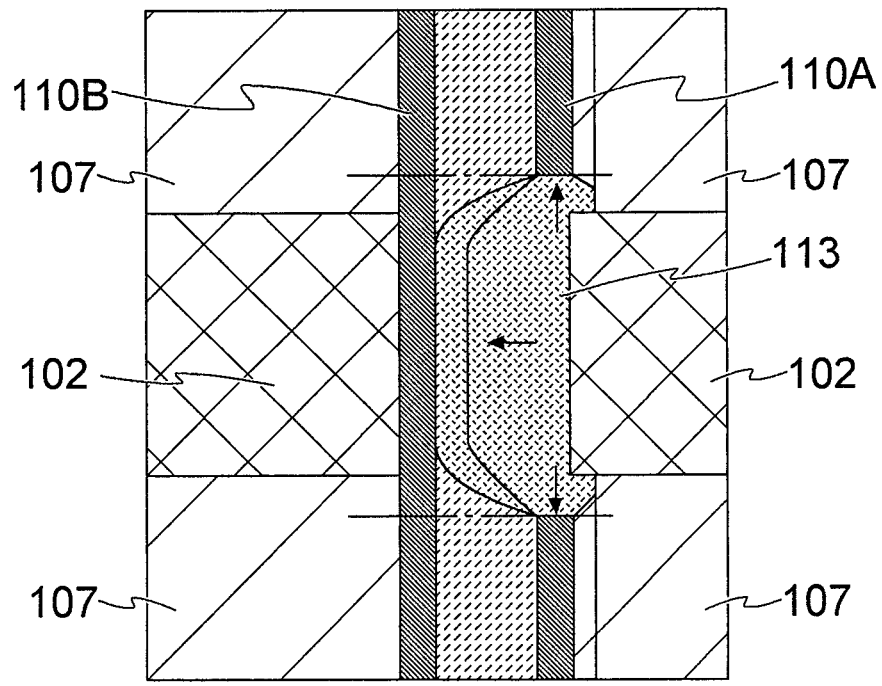
FIG. 8H is an enlarged plan view taken along with Z2-Z2 of FIG. 8F.

Here, epitaxial silicon layer 113 provided between first silicon pillar 101A and second silicon pillar 101B and located over first word line 109A is called as first contact pad 113A and epitaxial silicon layer 113 provided between first silicon pillar 101A and third silicon pillar 101C and located over second word line 109B is called as second contact pad 113B (see FIG. 8B). In addition, as illustrated in FIG. 8A, a plurality of epitaxial silicon layers 113 (contact pads) are arranged at intervals in the second trench and each contact pad is located in the trench provided on the semiconductor region (silicon pillar 101P).

Thereafter, a capacitor and subsequent components are formed using existing methods and, thus, semiconductor device (DRAM) 100 according to the present invention can be formed. For example, interlayer insulating film 114 is formed, a storage node hole (SNH) for forming the lower electrode (referred to as a storage node electrode or an SN electrode) of the capacitor is formed in a region including epitaxial silicon layer 113, and upper diffusion layer 115 is formed in an upper portion of silicon pillar 101P and within epitaxial silicon layer 113 by ion implantation, as illustrated in FIG. 9B. Then, SN electrode 116, capacitive insulating film 117, upper electrode 118, polysilicon layer 119, and plate electrode 120 are formed in order.

Figure 9A:
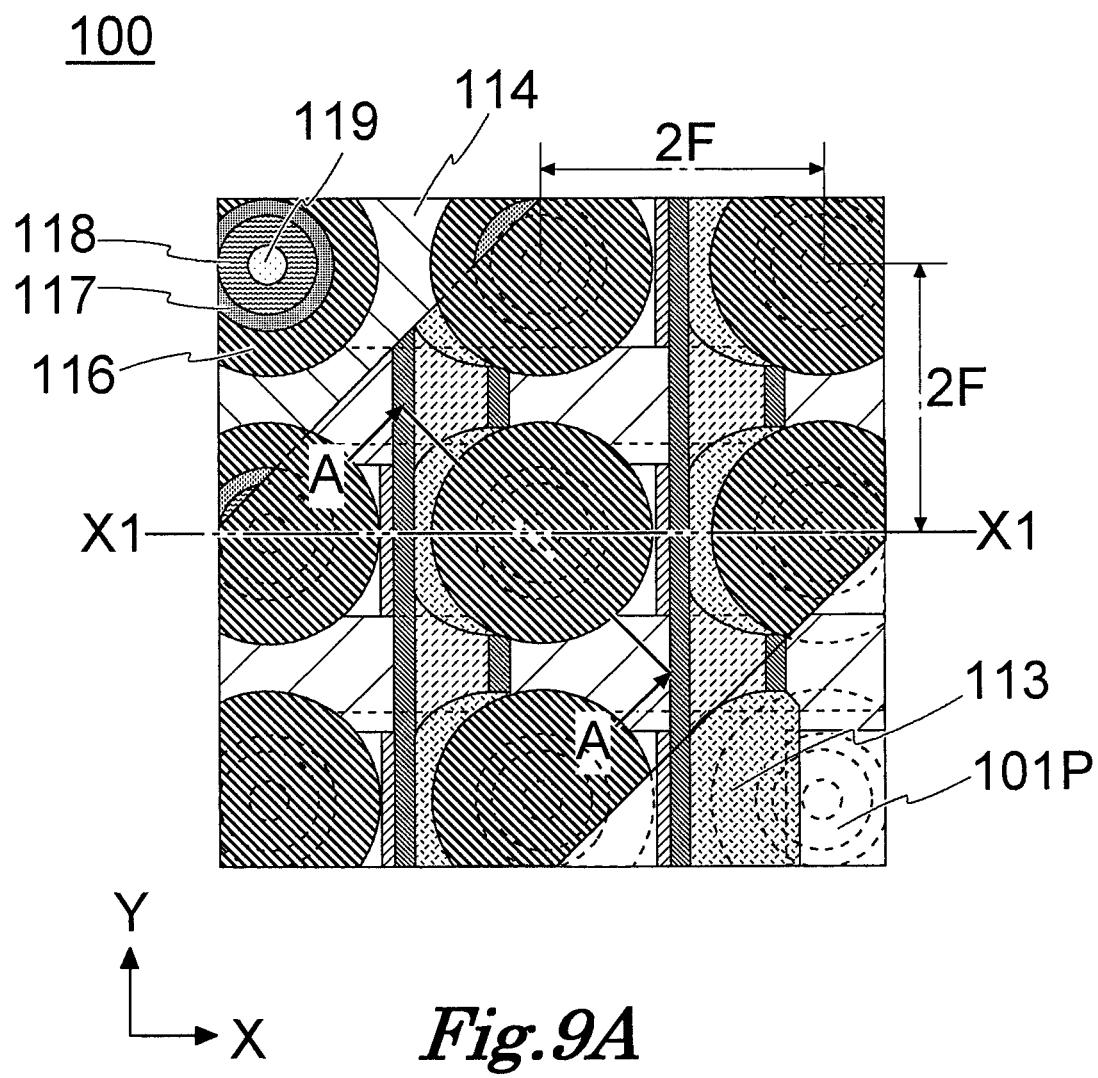
Figure 9B:
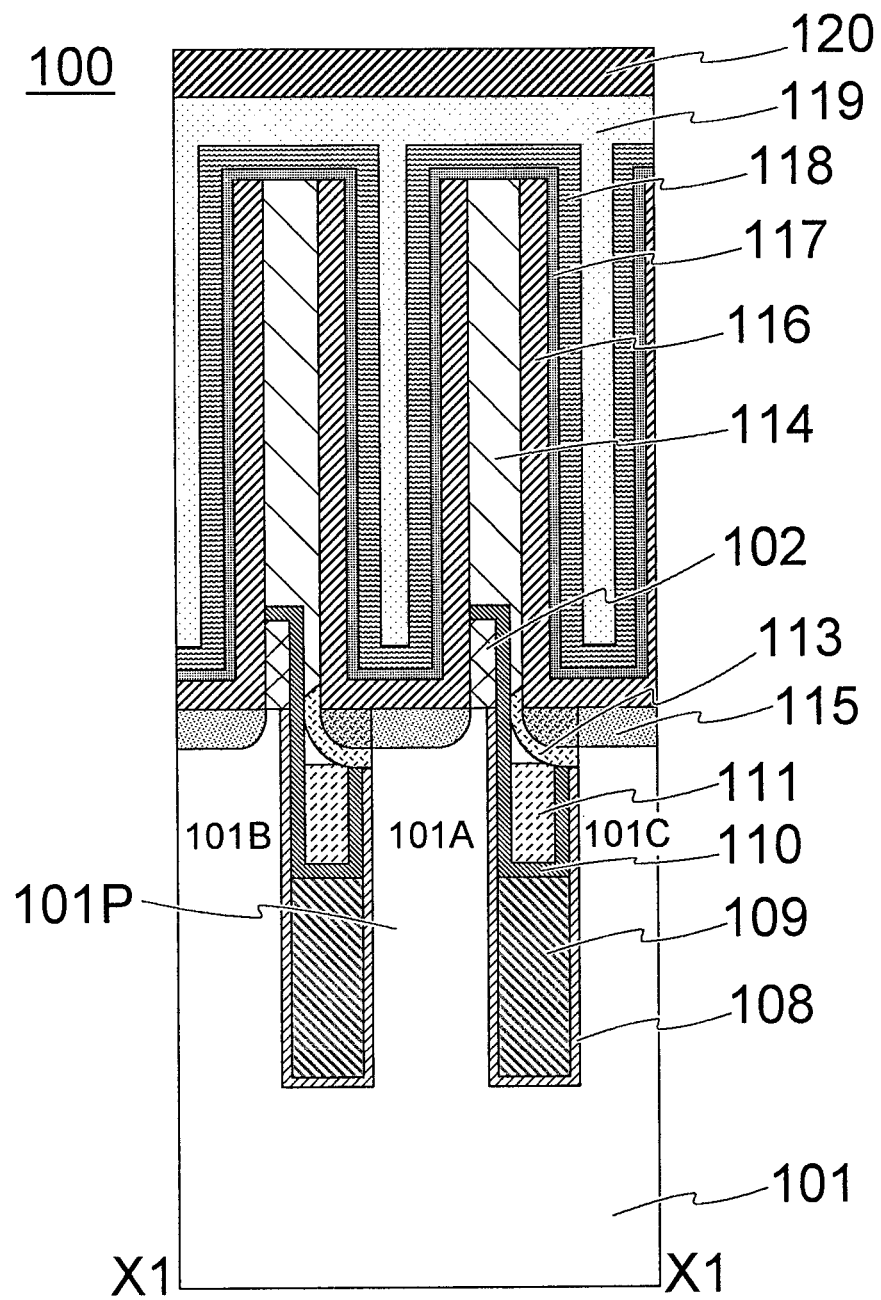
Figure 9C:
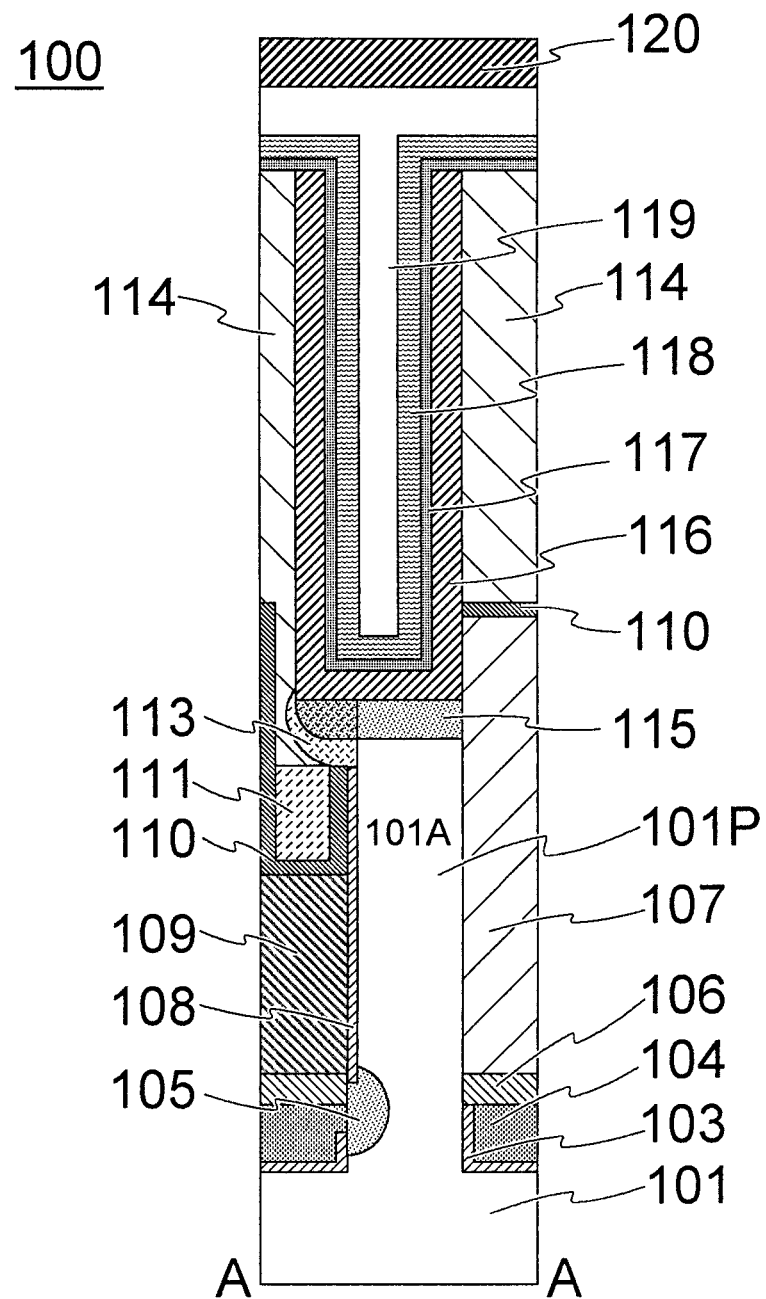

As illustrated in FIG. 9C, a vertical transistor including lower diffusion layer 105 to serve as one of a source and a drain in a lower portion of silicon pillar 101P, upper diffusion layer 115 to serve as the other one of the source and the drain, silicon pillar 101P to serve as a channel, and word line 109 faced to a channel via gate insulating film 108 and to serve as a gate electrode is formed in semiconductor device 100 according to the present invention. In addition, semiconductor device 100 includes a contact pad composed of epitaxial silicon layer 113 in an upper side surface of silicon pillar 101P. The uppermost surface of the contact pad is positioned higher than the uppermost surface of silicon pillar 101P to further increase an area of contact with upper conductors, such as SN electrode 116 of the capacitor.

In addition, as illustrated in the schematic transverse cross-sectional view of FIG. 9A, capacitors disposed on fine silicon pillars are formed into a 4F2 array. FIG. 9A respectively illustrates, from an upper-left corner to a lower-right corner, a transverse cross section across the intermediate portions of capacitors, a transverse cross section from which interlayer insulating film 114 is removed at the bottom of each lower electrode and a transverse cross section across the upper surface of silicon pillar 101P with an exception of interlayer insulating film 114.

As described above, according to the present invention, a contact area can be secured using epitaxial silicon layer 113 formed on one upper side surface of each silicon pillar as a contact pad. In addition, large margins of short-circuiting with adjacent elements can be secured since second silicon nitride film 110B is formed on a side surface of a silicon pillar opposed to an epitaxial growth face, i.e., second silicon pillar 101B adjacent to first silicon pillar 101A in the first direction. Word line 109 (second word line 109B) is also present as a second interconnect between each first silicon pillar 101A and each of third silicon pillars 101C aligning on the opposite side of first silicon pillar 101A from second silicon pillar 101B. In addition, second silicon nitride film 110B is interposed between epitaxial silicon layer 113 formed on one upper side surface of third silicon pillar 101C to serve as a second contact pad and first silicon pillar 101A, so that first silicon pillar 101A and second contact pad are electrically isolated from each other.

In the exemplary embodiments described above, epitaxial silicon layer 113 is formed as a contact pad for the lower electrode of each capacitor. The present invention is not limited to this configuration, however. Epitaxial silicon layer 113 can be formed as a contact pad for a contact plug. In addition, first silicon nitride film 102 can be removed by wet etching or the like prior to forming interlayer insulating film 114. Yet additionally, epitaxial silicon layer 113 can be etched back so as to be flush with the upper surface of silicon pillar 101P.

What is claimed is:

1. A semiconductor device comprising:
a semiconductor substrate;
a semiconductor pillar formed on a surface of the semiconductor substrate, an upper portion of the semiconductor pillar comprising an epitaxially grown silicon layer, the epitaxial silicon layer having at least a portion which extends sideward to form an overhang;
a gate electrode embedded in a first trench adjacent to the semiconductor pillar and formed on a side surface of the semiconductor pillar and extending as a line;
a storage element formed on the epitaxial silicon layer; and
a source/drain region embedded at a location lower than the gate electrode and being elongated so as to form a line shape, wherein the source/drain region is formed only on one side of the semiconductor pillar.

2. The semiconductor device according to claim 1, further comprising:
a second trench formed on a surface of a semiconductor substrate; and
a first interconnect embedded in a lower portion of the second trench and in contact with the source/drain region.

3. A semiconductor device comprising:
a semiconductor substrate;
a semiconductor pillar formed on a surface of the semiconductor substrate;
a source/drain region in an upper portion of the semiconductor pillar;
a gate electrode embedded in a lower portion of a trench and formed on a side surface of the semiconductor pillar and extending as a word line, the trench being adjacent to the semiconductor pillar;
a dielectric capping layer formed in an upper portion of the trench and on a top surface of the gate electrode;

an epitaxial silicon layer grown at an upper portion of the semiconductor pillar, the epitaxial silicon layer having at least a portion grown sideward from the semiconductor pillar to partially overhang the dielectric capping layer and the gate electrode; and a capacitor for data storage.

4. The semiconductor device according to claim 3, wherein the dielectric capping layer comprises silicon nitride.

5. The semiconductor device according to claim 3, wherein the capacitor has a lower electrode formed on the epitaxial silicon layer.

6. The semiconductor device according to claim 3, wherein the dielectric capping layer comprises at least a first dielectric film and a second dielectric film.

7. The semiconductor device according to claim 6, wherein the first dielectric film conformally covers a top surface of the gate electrode and a side surface of the semiconductor pillar, and the second dielectric film fills the remaining space of the trench.

\* \* \* \* \*